United States Patent [19]

Alvarez et al.

[11] Patent Number: 4,803,175
[45] Date of Patent: Feb. 7, 1989

[54] METHOD OF FABRICATING A BIPOLAR SEMICONDUCTOR DEVICE WITH SILICIDE CONTACTS

[75] Inventors: Antonio R. Alvarez, Sunnyvale, Calif.; James A. Kirchgessner, Mesa, Ariz.

[73] Assignee: Motorola Inc., Schaumburg, Ill.

[21] Appl. No.: 95,782

[22] Filed: Sep. 14, 1987

[51] Int. Cl.$^4$ .......................................... H01L 21/265
[52] U.S. Cl. .................................. 437/31; 437/200; 437/233; 437/193; 437/228; 148/DIG. 10; 148/DIG. 11; 357/34
[58] Field of Search ................... 437/31, 32, 33, 200, 437/193, 228, 238, 233, 245, 246; 148/DIG. 10, DIG. 11, DIG. 124, DIG. 147, DIG. 19; 357/59 H, 34; 156/643, 657, 653

[56] References Cited

U.S. PATENT DOCUMENTS

| | | | |
|---|---|---|---|
| 3,460,007 | 8/1969 | Scott | 148/DIG. 124 |
| 3,940,288 | 2/1976 | Takagi | 148/DIG. 124 |
| 4,188,707 | 2/1980 | Asano et al. | 148/DIG. 124 |
| 4,259,680 | 3/1981 | Lepselter | 437/162 |
| 4,609,568 | 9/1986 | Koh et al. | 437/99 |
| 4,674,173 | 6/1987 | Hahn et al. | 437/33 |
| 4,682,409 | 7/1987 | Thomas et al. | 148/DIG. 19 |
| 4,698,127 | 10/1987 | Hideshima | 156/143 |
| 4,705,599 | 11/1987 | Suda et al. | 437/200 |

Primary Examiner—Brian E. Hearn
Assistant Examiner—Kevin McAndrews
Attorney, Agent, or Firm—Harry A. Wolin

[57] ABSTRACT

A method for making a bipolar semiconductor device having silicide contacts which is compatible with the processing steps used in the fabrication of MOS devices. The present invention includes the use of sidewall spacers to limit the self-aligned implants of the extrinsic base and the silicide contact. The device is annealed so that the diffusion of the polysilicon layer which forms the emitter may be controlled. Since the emitter size may be controlled, the emitter to base contact area may be reduced resulting in improved device performance.

14 Claims, 3 Drawing Sheets

METHOD OF FABRICATING A BIPOLAR SEMICONDUCTOR DEVICE WITH SILICIDE CONTACTS

BACKGROUND OF THE INVENTION

This invention generally pertains to a method of fabricating a bipolar semiconductor device having silicide contacts. Generally, in fabricating bipolar devices and the like, it is desirable to be able to use processing steps which are compatible with those used in a fabrication of MOS devices. This not only decreases the number of processing steps needed to fabricate a bipolar device, but also allows a bipolar device to be processed in conjunction with an MOS device thereby enabling composite integrated circuits to be more easily manufactured and used. The bipolar device fabrication will differ from that of an MOS device in that an active base must be formed and no gate dielectric layer is utilized. Therefore, this bipolar arrangement will have doped polysilicon directly on the substrate in its emitter region. Further, the emitter to base contact area is reduced which results in improved device performance.

SUMMARY OF THE IVENTION

The present invention pertains to a method for making a bipolar semiconductor device with silicide contacts. The method used in the present invention is one which is compatible with methods commonly used in the fabrication of MOS devices. Once a device region is isolated on a substrate, a first dielectric layer is formed. An emitter opening is defined in the first dielectric layer following the implantation of an active base in the device region of the substrate. Next, a polysilicon layer is deposited on the dielectric layer and is doped. This polysilicon layer is masked and etched so that a desired configuration may be obtained. Next, a self-aligned implant is used to provide an extrinsic base in the substrate followed by a conformal dielectric layer which is etched away to provide for sidewall spacers. After the device is annealed, silicide contacts are formed using the sidewall spacers. However, the extrinsic base may be implanted following the formation of the sidewall spacers. After a second dielectric layer is formed over the device region, contact openings are etched which extend to the silicide contact followed by the metallization of these contact openings.

It is an object of the present invention to provide a new and improved method for making a bipolar semiconductor device with silicide contacts which is compatible with methods used to fabricate MOS devices.

It is a further object of the present invention to provide a new and improved method for making a bipolar semiconductor device with silicide contacts which reduces the emitter to base contact area thereby resulting in increased device density and improved device performance.

It is a further object of the present invention to a new and improved method for making a bipolar semiconductor device with silicide contacts having a reduced number of processing steps.

It is a further object of the present invention to provide a new and improved method for making a bipolar semiconductor device with silicide contacts which employs the application of a sidewall spacer and silicide techniques.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
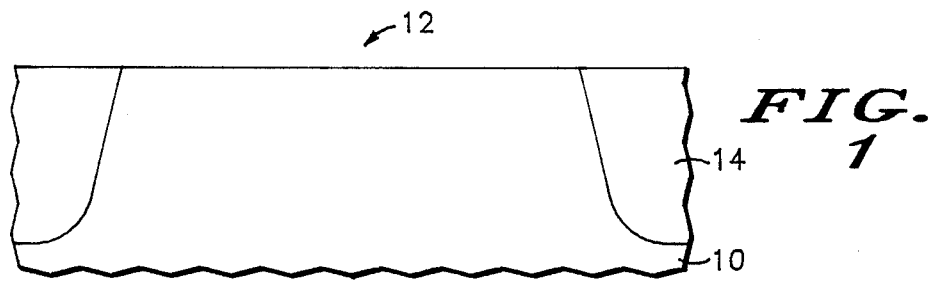
FIGS. 1-10 are highly enlarged cross-sectional views of a section of a bipolar device during various stages of processing.
Figure 2:
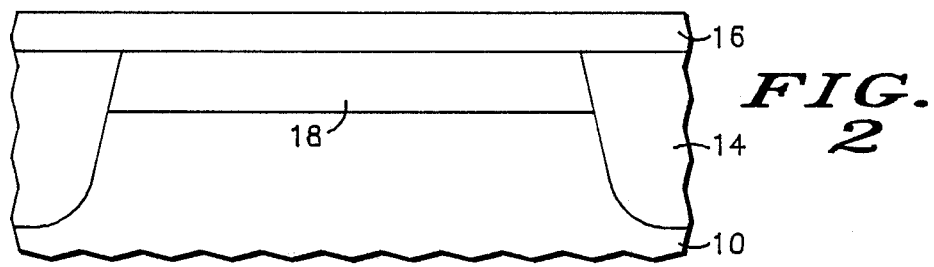
Figure 3:
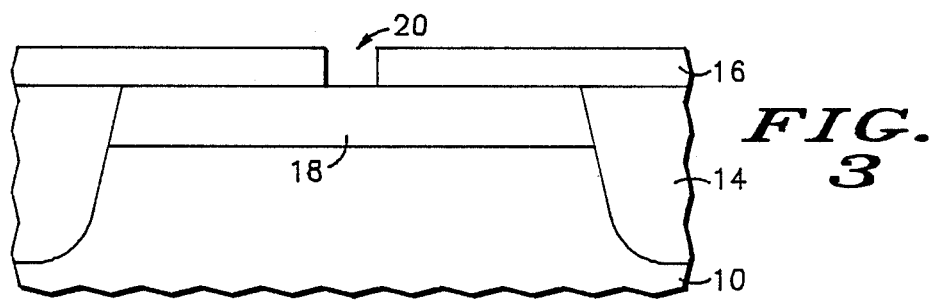
Figure 4:
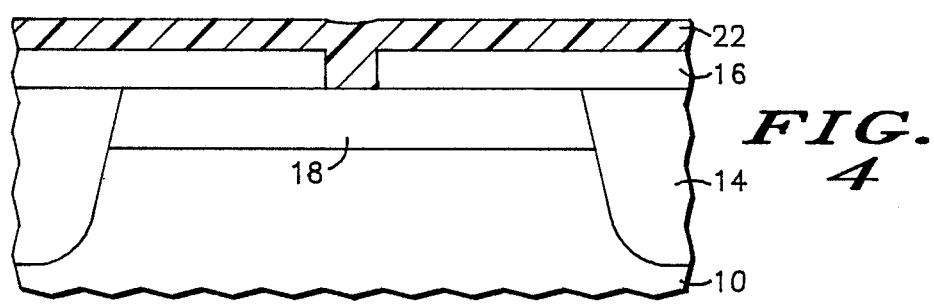
Figure 5:
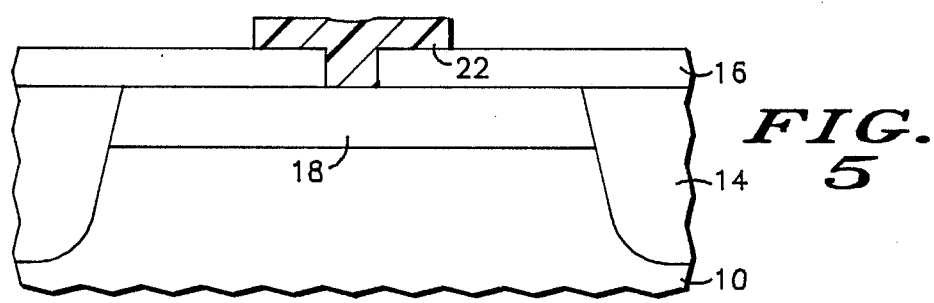
Figure 6:
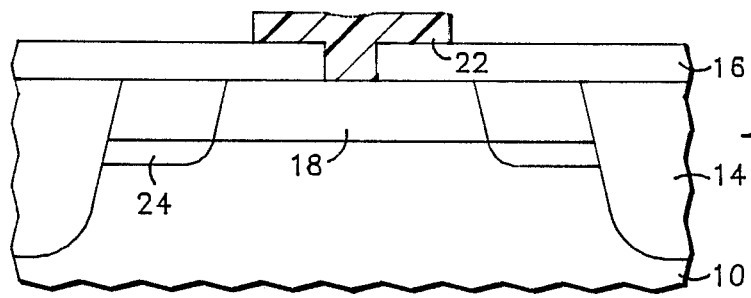
Figure 7:
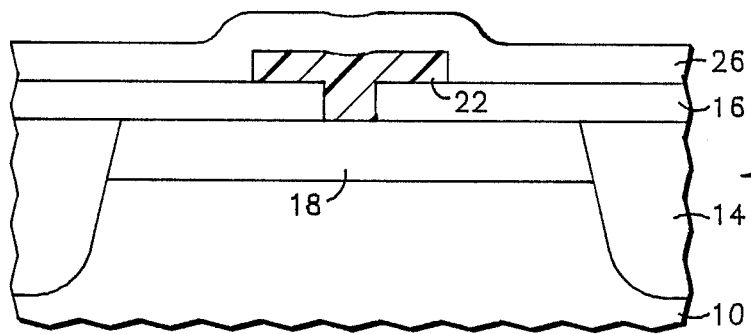
Figure 8:
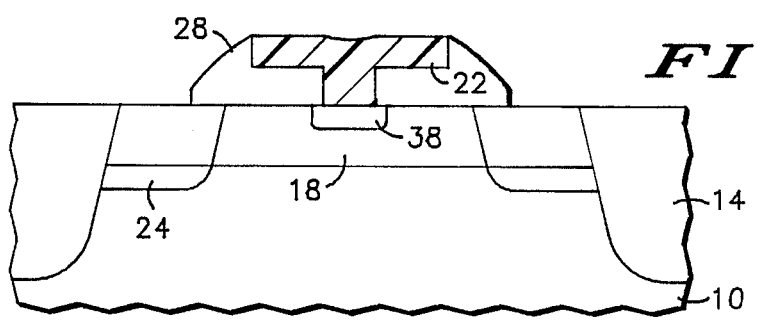
Figure 9:
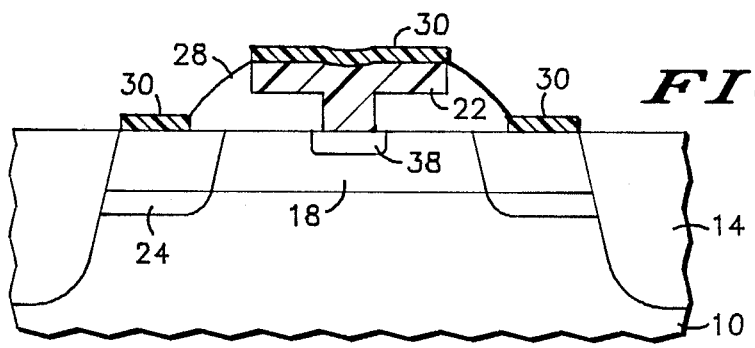
Figure 10:
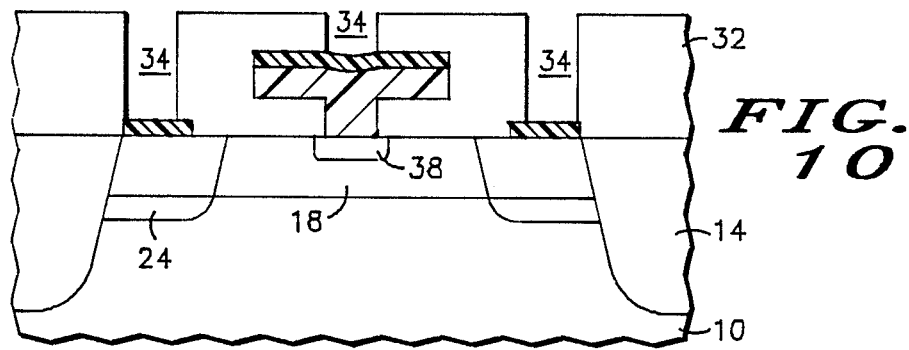

Referring specifically to FIGS. 1-10, highly enlarged cross-sectional views of a section of a bipolar semiconductor device are shown during various stages of processing. It should be noted that the collector contact and buried layer regions are not shown in these figures. Initially, a substrate, 10, is provided. A device region, 12, is isolated on substrate 10 by isolation areas 14. This is well known in the art. Following the isolation of device region 12 on substrate 10, a first dielectric layer, 16 is formed on substrate 10. An active base, 18, is then implanted in device region 12 of substrate 10. An additional dielectric layer may be formed following the implantation if a thicker first dielectric layer is desired. Following the implantation of active base 18, an emitter opening, 20, is defined in first dielectric layer 16. Once emitter opening 20 has been defined, a polysilicon layer, 22, is deposited in emitter opening 20 and on first dielectric layer 16. After polysilicon layer 22 has been doped, it is masked and etched so that it extends beyond emitter opening 20. It should be understood that polysilicon layer 22 and active base 18 are of opposite conductivity types.

In one embodiment of the present invention (see FIG. 6), an extrinsic base, 24, may be implanted in device region 12 of substrate 10. This is done by using etched polysilicon layer 22 so that a self-aligned implant may occur. In another embodiment of the present invention (see FIGS. 7 and 8), a conformal dielectric layer, 26, is formed on first dielectric layer 16 and etched polysilicon layer 22. Conformal dielectric layer 26 and first dielectric layer 16 are then etched so that sidewall spacers, 28, are formed. Commonly, an anisotropic etch of first dielectric layer 16 and conformal dielectric layer 26 is used to form sidewall spacers 28. Following the formation of sidewall spacers 28, extrinsic base 24 is implanted. Sidewall spacers 28 enable the self-aligned implantation of extrinsic base 24 to cover a lesser area than if sidewall spacers 28 were not employed. The size of sidewall spacers 28 enable the size of extrinisc base 24 to be controlled. It should be understood that sidewall spacers 28 may be employed after the implantation of extrinsic base 24 for reasons which will be discussed presently. After the formation of extrinsic base 24, the bipolar device is annealed so that the desired dopant profile and device characteristics may be obtained. This annealing causes an emitter, 38, to diffuse from doped polysilicon layer 22 beneath emitter opening 20. Since the annealing will control the size of emitter 38, the emitter to base contact area may be controlled. A reduced emitter to base contact area allows for improved device performance.

Next, silicide contacts, 30, are formed. Sidewall spacers 28 may be used to control the size of silicide contacts 30 which are formed over active base 24. In addition to being formed over active base 24, a silicide contact 30 is formed over polysilicon layer 22 and serves as an emitter contact. Following the formation of silicide contacts 30, a second dielectric layer, 32, is formed over substrate 10. Following the formation of second dielectric layer 32, contact openings, 34, are etched in second dielectric layer 32. Contact openings 34 extend to the various silicide contacts 30.

Figure 11:
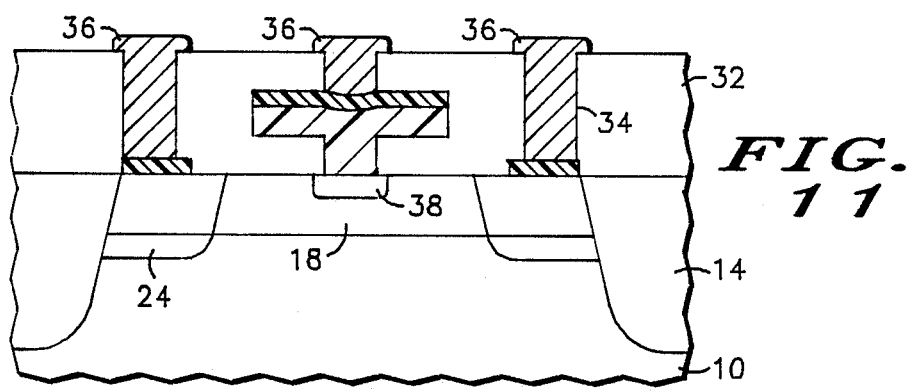
FIG. 11 is a highly enlarged cross-sectional view of a section of a bipolar device.

Referring specifically to FIG. 11, a highly enlarged cross-sectional view of a section of a bipolar semiconductor device having silicide contacts is shown. In this embodiment, it can be seen that contact openings 34 have been metallized and a plurality of metal contacts, 36, extend therefrom. However it should be understood that other contact means which are well known in the art may be used. Metal contacts 36 serve as emitter and base contacts accordingly in this figure.

Thus it is apparent that there has been provided, in accordance with the invention, an improved method or making a bipolar semiconductor device with silicide contacts which meet the objects and advantages set forth above. While specific embodiments of this invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A method of processing a bipolar semiconductor device comprising the steps of:
   providing a substrate;
   isolating a device region on said substrate;
   forming a first dielectric layer on said substrate;
   forming an active base in said device region of said substrate;
   defining an emitter opening in said first dielectric layer;
   depositing a polysilicon layer on said first dielectric layer and in said emitter opening;
   doping said polysilicon layer;
   masking and etching said polysilicon layer so that said polysilicon extends beyond said emitter opening;
   etching said first dielectric layer so that only the portion covered by said etched polysilicon layer remains;
   forming silicide contacts on said polysilicon layer and said base;
   forming a second dielectric layer on said device region;
   etching contact openings in said second dielectric layer, said contact openings extending to said silicide contacts; and
   metallizing said contact openings to create external contacts.

2. The method of claim 1 wherein the polysilicon layer and the active base are of opposite conductivity types.

3. The method of claim 2 further comprising the step of forming an extrinsic base.

4. The method of claim 3 wherein the steps of forming an active base and forming an extrinsic base are performed by implantation.

5. The method of claim 4 wherein a self-aligned implant is performed to implant the extrinsic base during or directly following the etching of the polysilicon layer.

6. The method of claim 3 wherein after the etching of the polysilicon layer, a conformal dielectric layer is formed over the device region and the conformal dielectric layer and the first dielectric layer are etched to provide for sidewall spacers.

7. The method of claim 6 wherein a self-aligned implant is performed to implant the extrinsic base following the processing of the sidewall spacers.

8. The method of claim 1 wherein the formation of the silicide contacts is self-aligned.

9. The method of claim 1 wherein the device is annealed prior to the formation of the silicide contacts.

10. The method of claim 6 wherein the first dielectric layer, the second dielectric layer and the conformal dielectric layer may be one of the group comprising an oxide, a nitride and a combination of an oxide and a nitride.

11. A method of processing a bipolar semiconductor device comprising the steps of:
    providing a substrate;
    isolating a device region on said substrate;
    forming a first dielectric layer on said substrate;
    forming an active bse in said device region of said substrate;
    defining an emitter opening in said first dielectric layer;
    depositing a polysilicon layer on said first dielectric layer and in said emitter opening;
    doping said polysilicon layer;
    masking and etching said polysilicon layer so that said polysilicon extends beyond said emitter opening;
    forming a conformal dielectric layer on said etched polysilicon layer and said first dielectric layer;
    etching said conformal dielectric layer and said first dielectric layer to form sidewall spacers;
    forming an extrinsic base in said substrate using said sidewall spacers for self-alignment;
    annealing said device so that an emitter is diffused from said polysilicon layer into said active base;
    forming silicide contacts using said sidewall spacers for self-alignment;
    forming a second dielectric layer on said device region,
    etching contact opening in said second dielectric layer, said contact openings extending to said silicide contacts; and
    metallizing said contact openings to create external contacts.

12. The method of claim 11 wherein the polysilicon layer and the active base are of opposite conductivity types.

13. The method of claim 12 wherein the first dielectric layer, the second dielectric layer, and the conformal dielectric layer may be one of the group comprising an oxide, a n itride and a combination of an oxide and a nitride.

14. The method of claim 12 wherein the steps of forming an active base and forming an extrinsic base are performed by implantation.

* * * * *